United States Patent
Rha

(10) Patent No.: US 6,294,462 B1
(45) Date of Patent: Sep. 25, 2001

(54) MANUFACTURING METHOD OF INTERCONNECTION LAYER FOR SEMICONDUCTOR DEVICE

(75) Inventor: Sa Kyun Rha, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/129,000

(22) Filed: Aug. 4, 1998

(30) Foreign Application Priority Data

Dec. 22, 1997 (KR) .................................................. 97-71889

(51) Int. Cl.⁷ ................................................. H01L 21/4763
(52) U.S. Cl. .......................... 438/641; 438/622; 438/627; 438/637; 438/674
(58) Field of Search .................................. 438/618, 622, 438/637, 641, 643, 653, 674, 679, 680, 681, 687, 627

(56) References Cited

U.S. PATENT DOCUMENTS

| | | | |
|---|---|---|---|
| 5,219,788 | * 6/1993 | Abernathey et al. | 438/636 |
| 5,316,974 | * 5/1994 | Crank | 438/643 |
| 5,484,747 | * 1/1996 | Chien | 438/644 |
| 5,506,449 | 4/1996 | Nakano et al. | 257/758 |
| 5,547,883 | * 8/1996 | Kim | 438/158 |
| 5,635,423 | 6/1997 | Huang et al. | 438/638 |
| 5,654,245 | * 8/1997 | Allen | 438/629 |
| 5,891,804 | * 4/1999 | Havemann et al. | 438/674 |
| 5,893,752 | * 4/1999 | Zhang et al. | 438/687 |
| 5,968,333 | * 10/1999 | Nogami et al. | 205/184 |
| 5,969,422 | * 10/1999 | Ting et al. | 257/762 |
| 5,972,786 | * 10/1999 | Hoshino et al. | 438/627 |
| 6,077,780 | * 6/2000 | Dubin | 438/687 |

OTHER PUBLICATIONS

Palmans et al, "Development of an Electroless Copper Deposition Bath for Via Fill Applications on TiN Seed Layers", 1995, Conf. Proc. Advanced Metallization for ULSI Applications in 1994; Materials Research Society, pp. 87–94.*

Wolf et al; 1986 "Silicon Processing for the VLSI Era, vol. 1–Process Technology"; 1986; p. 539.*

* cited by examiner

Primary Examiner—Carl Whitehead, Jr.
Assistant Examiner—Jamie L. Brophy
(74) Attorney, Agent, or Firm—Morgan, Lewis & Bockius LLP

(57) ABSTRACT

A method of manufacturing an interconnection layer for a semiconductor device comprising the steps of forming a conductive pattern near a surface of a semiconductor substrate or on the surface of the semiconductor substrate, forming an insulation layer on a surface of the conductive pattern, forming grooves in the insulation layer exposing portions of the conductive pattern, forming a first barrier layer pattern on an upper surface of the insulation layer and on sidewalls and bottoms of each of the grooves, selectively forming a seed layer on portions of the first barrier layer pattern, selectively forming a copper interconnection layer on the first barrier layer pattern and the seed layer, and forming a second barrier layer on an upper surface and sides of the copper interconnection layer.

24 Claims, 4 Drawing Sheets

MANUFACTURING METHOD OF INTERCONNECTION LAYER FOR SEMICONDUCTOR DEVICE

BACKGROUND OF THE INVENTION

This application claims the benefit of Korean Patent Application No. 71889/1997, filed Dec. 22, 1997, which is hereby incorporated by reference.

1. Field of the Invention

The present invention relates to a semiconductor device, and more particularly, to a manufacturing method of a copper interconnection layer for a semiconductor device.

2. Discussion of the Related Art

Generally, aluminum (Al) has been used as a conventional interconnection layer for semiconductor devices due to its ease of use in a manufacturing process and low contact resistance. However, as semiconductor devices have become more highly integrated, the length of an interconnection line has become longer while its width has become narrower. Consequently, the resistance of the interconnection line increases. Also, more highly integrated semiconductor devices have an insulation film with a reduced thickness and with increased parasitic capacitance.

A number of studies have explored using metals with lower resistance compared to Al and having good electromigration properties for the interconnection of semiconductor devices. Copper has been considered as a new interconnection material for semiconductor devices. Copper has a relatively low specific resistivity (approximately 1.67 $\mu\Omega/Cm$) and excellent electromigration properties. Also, copper will not reduce the operational speed of the semiconductor device even if the cross-sectional area of the interconnection is reduced.

A conventional manufacturing method of a copper interconnection will now be described in detail with reference to the accompanying drawings.

FIGS. 1–5 illustrate the conventional manufacturing method of the copper interconnection for the semiconductor device.

Figure 1:
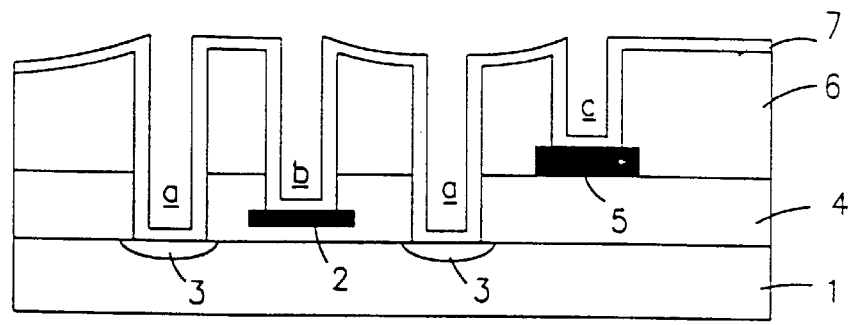

As shown in FIG. 1, a gate electrode 2 is formed on an upper surface of a semiconductor substrate 1, and an n+ or p+ diffusion layer 3 is formed inside the semiconductor substrate 1 at both sides of the gate electrode 2. A first insulation layer 4 is applied over the diffusion layer 3 and the gate electrode 2, a bit line 5 is formed on the insulation layer 4, and a second insulation layer 6 is deposited on the bit line 5. Grooves a, b, and c are formed on surfaces of the diffusion layer 3, the gate electrode 2, and the bit line 5 in order to connect to an interconnection layer (formed later). A first barrier layer 7 (a contact layer) is formed at the sidewalls and bottoms of the grooves a, b, c, and on an upper surface of the second insulation layer 6. The first barrier layer 7 includes at least one of Ti, TiN, TaN, TiW, TaW, TiSi$_x$Y$_y$, or TaSi$_x$Y$_n$ film.

Figure 2:
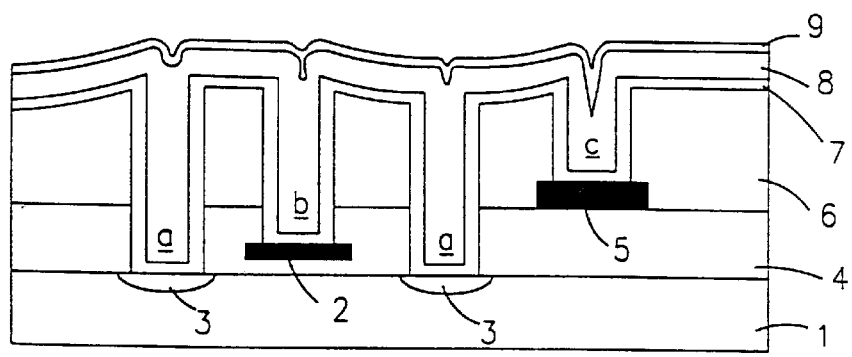

As shown in FIG. 2, a copper layer 8 is formed on the first barrier layer 7 by chemical vapor deposition (CVD), sputtering, ion cluster beam deposition (ICBD), or electroplating. An incubation time of forming the copper layer 8 in the grooves a, b, c is longer than that of forming the copper layer 8 on the insulation layer 6. Thus, incubation time should be determined in accordance with the incubation time of forming the copper layer 8 in the grooves a, b, c. Also, each portion of the copper layer 8 formed in the grooves a, b, c should be thicker than each portion of the copper layer 8 formed on the upper surface of the second insulation layer 6. An overall time of forming the copper layer 8 is determined by a time of forming the portion of the copper layer 8 in the grooves a, b, c. Accordingly, the time required to form the copper layer 8 increases. A second barrier layer 9 serving as a diffusion barrier is formed on the copper layer 8. The second barrier layer 9 includes at least one of Ti, TiN, TiW, TaN, TaW, TiSi$_x$Y$_y$, or TaSi$_x$Y$_n$. film.

Figure 3:
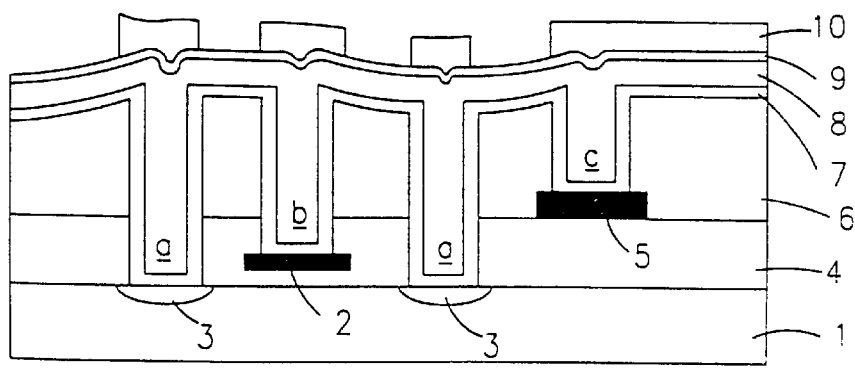

As shown in FIG. 3, a photoresist film (not shown) is applied over the second barrier layer 9 and patterned, forming a photoresist mask 10. Using the photoresist mask 10, the first barrier layer 7, the copper layer 8, and the second barrier layer 9 are etched as shown in FIG. 4, forming a sandwich pattern 11 including the remaining first barrier layer 7, the copper layer 8, and the second barrier layer 9.

Figure 4:
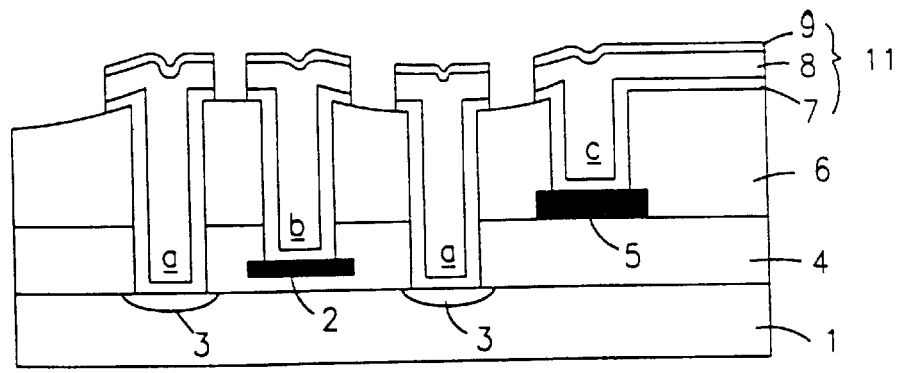
Figure 5:
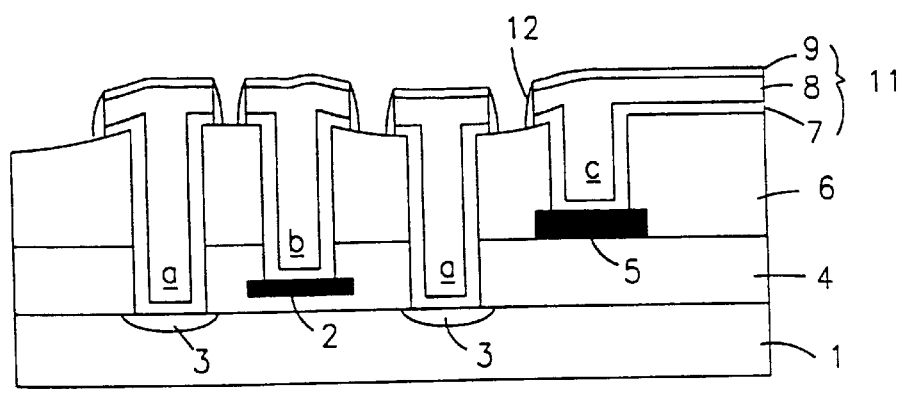

As shown in FIG. 5, to form a diffusion barrier on each sidewall of the sandwich pattern 11, a third barrier layer (not shown) is formed on an upper surface of the semiconductor device shown in FIG. 4, and an etch-back process is performed on the third barrier layer, forming a sidewall spacer 12. The third barrier layer remains on each sidewall of the sandwich pattern 11. The third barrier layer includes at least one of Ti, TiN, TiW, TaN, TaW, TiSi$_x$Y$_y$, or TaSi$_x$Yfilm.

The conventional copper layer 8 having low specific resistivity and excellent electromigration properties is capable of maintaining the operational speed and reliability of the semiconductor device despite a small cross-sectional area of the interconnection. Applying CVD thereto using an organic compound allows for a simple manufacturing process. However, the conventional copper layer 8 easily oxidizes and rapidly diffuses in silicon or insulating material.

In addition, in the conventional manufacturing method of the copper layer 8, a dry-etching process of the copper layer 8 is required to form the interconnection. However, the dry-etching process of a copper thin film has not been developed yet.

Also, the incubation time of forming the copper layer by CVD is long, resulting in a low manufacturing throughput.

SUMMARY OF THE INVENTION

Accordingly, the present invention is directed to a manufacturing method of a copper interconnection layer for a semiconductor device that substantially obviates the problems and disadvantages due to the limitations of the related art.

An object of the present invention is to provide a manufacturing method of a copper interconnection layer for a semiconductor device capable of solving the problems of low throughput due to a long incubation time and a difficulty of a dry-etching process while maintaining low resistance and excellent electromigration properties of copper.

Another object of the present invention is to provide a manufacturing method of a copper interconnection layer for a semiconductor device that eliminates a dry-etching process and improves manufacturing throughput.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in accordance with a first aspect of the present invention there is provided a method of manufacturing an interconnection layer for a semiconductor device comprising the steps of forming a conductive pattern near a surface of a semiconductor device or on the surface of the semiconductor substrate, forming an insulation layer on a surface of the conductive pattern, forming grooves in the insulation layer exposing portions of the conductive pattern, forming a first barrier layer pattern on an upper surface of the insulation layer and on sidewalls and bottoms of each of the grooves, selectively forming a seed layer on portions of the first barrier layer pattern, selectively forming a copper interconnection layer on the first barrier layer pattern and the seed layer, and forming a second barrier layer on an upper surface and sides of the copper interconnection layer.

In another aspect of the present invention is provided a method of manufacturing an interconnection layer for a semiconductor device including the steps of forming a conductive pattern in a surface of a semiconductor device or on the surface of the semiconductor substrate, forming an insulation layer on an upper surface of the conductive pattern, forming at least one cavity having sidewalls and a bottom in the insulation layer exposing upper surfaces of the conductive pattern, forming a first barrier layer on an upper surface of the insulation layer and on the sidewalls and bottom of the at least one cavity, selectively forming a seed layer on portions of a surface of the first barrier layer and the sidewalls and the bottom of the at least one cavity, selectively forming a copper interconnection layer on the first barrier layer and the seed layer, and forming a second barrier layer on the copper interconnection layer.

It is to be understood that both the foregoing general description and the following detailed description are exemplary and explanatory and are intended to provide and further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1–5 illustrate a conventional manufacturing method of an interconnection layer for a semiconductor device; and FIGS. 6–11 illustrate a manufacturing method of an interconnection layer for a semiconductor device according to the present invention.

DETAILED DESCRIPTION OF THE PREFERRED EMBODIMENT

Reference will now be made in detail to the preferred embodiment of the present invention, an example of which is illustrated in the accompanying drawings.

Figure 6:
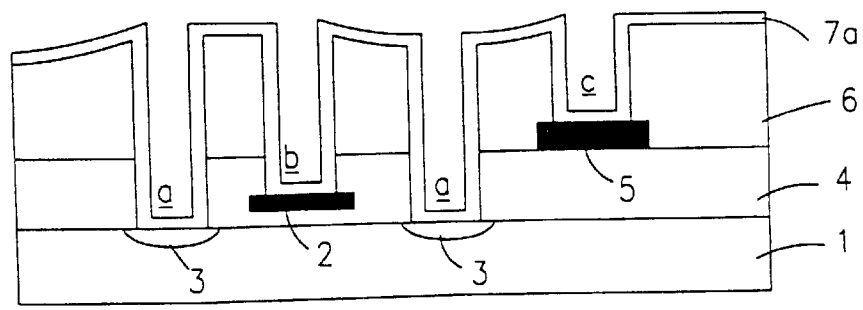

FIG. 6 illustrates a vertical cross-sectional view of a semiconductor device after a first barrier layer is formed.

A gate electrode 2 is formed on an upper surface of a semiconductor substrate 1, and an n+ or p+ diffusion layer 3 is formed near a surface of the substrate 1 at sides of the gate electrode 2. A first insulation layer 4 is formed over the diffusion layer 3 and the gate electrode 2, and a bit line 5 is formed thereon. A second insulation layer 6 is formed on the bit line 5. Grooves a, b, c are formed on upper surfaces of the diffusion layer 3, the gate electrode 2 and the bit line 5 for connecting to an interconnection layer.

A first barrier layer 7 (a contact layer) is formed on an upper surface of the second insulation layer 6, and on sidewalls and bottoms of the grooves a, b, c. The first barrier layer 7 includes at least one of Ti, TiN, TaN, TiW, TaW, $TiSi_xY_y$, or $TaSi_xY_n$ film.

Figure 7:
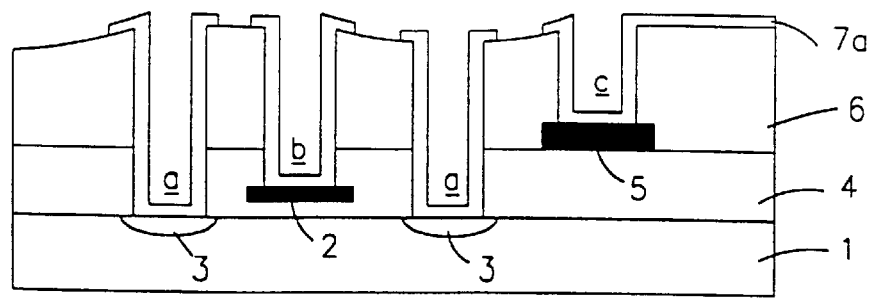

As shown in FIG. 7, the first barrier layer 7 is patterned to form a first barrier layer pattern 7a, which is a remaining portion of the first barrier layer 7.

Thereafter, copper, tungsten, or titanium nitrated oxide (TiN) having a thickness of 500 Å or less is deposited on an upper surface of the first barrier layer pattern 7a shown in FIG. 7 by metal organic chemical vapor deposition (MOCVD), electroplating, or sputtering, to form a conductive layer.

Figure 8:
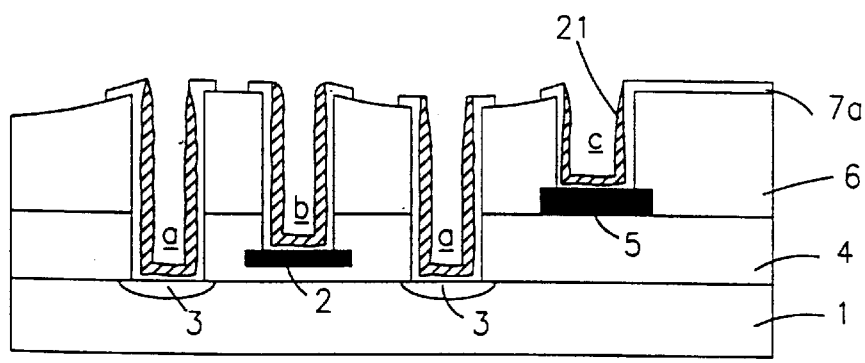
Figure 9:
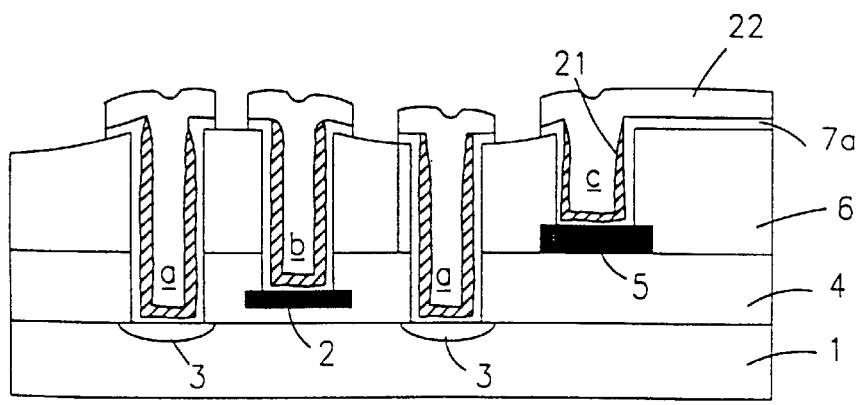

As shown in FIGS. 8 and 9, the conductive layer is etched back, and then the conductive layer is patterned so that the conductive layer remains on a part of the first barrier layer pattern 7a and in the grooves a, b, c, thus forming a seed layer 21. In a process of forming a metal film, the deposition rate of the metal film on the seed layer 21 (here, a copper interconnection layer 22 shown in FIG. 9), which is formed on the first barrier layer pattern 7a, is greater than that when copper is directly formed on the metal film on the first barrier layer pattern 7a without the seed layer 21.

Accordingly, both incubation times of forming the copper interconnection layer 22 on an upper surface of the first barrier layer pattern 7a on the insulation film 6 and forming the copper interconnection layer 22 in the grooves a, b, c are similar, reducing overall incubation time and maintaining good manufacturing throughput.

In addition, since the copper interconnection layer 22 formed in the grooves a, b, c is thicker than that formed on an upper surface of the insulation layer 6 in order to have a uniform upper surface of the copper interconnection layer 22, the deposition rate of the copper interconnection layer 22 formed in the grooves a, b, c should be higher than the deposition rate of the copper interconnection layer 22 formed on the upper surface of the insulation layer 6.

Table 1 illustrates experimented results of incubation times of forming an oxide, nitrated silicon, tungsten, or copper layer as a seed layer, and deposition rates of forming the copper interconnection layer 22 on each seed layer by MOCVD, electroplating, or sputtering.

TABLE 1

| | | MOCVD | ELECTRO-PLATING | SPUTTERING |
|---|---|---|---|---|
| SPECIFIC RESISTIVITY (4000 Å) | | >2.0 $\mu\Omega$ cm | >2.0 $\mu\Omega$ cm | >1.9 $\mu\Omega$ cm |
| DEPOSITION RATE | | <1000 Å/min | <5000 Å/min | <5000 Å/min |
| IN-CUBATION TIME | SEED LAYER | | | |
| | OXIDE | 15–30 min. | 15–30 min. | <1 min. |
| | NITRATED SILICON | 3–10 min. | 1–2 min. | <1 min. |
| | TUNGSTEN | 1–3 min. | 1–2 min. | <1 min. |
| | COPPER | <1 min. | <1 min. | <1 min. |

A seed layer having a desired incubation time may be selected in accordance with Table 1.

Further, as shown in FIG. 9, when the copper interconnection layer 22 is deposited by electroplating, or by MOCVD at pressures ranging between 0.01 and 1.0 torr at 140° C. to 220° C., the copper interconnection layer 22 fills the grooves a, b, c, and is also formed on the first barrier layer pattern 7a, because the deposition rate of the copper interconnection layer 22 formed on the seed layer 21 is greater than that of directly forming the copper interconnection layer 22 on the first barrier layer pattern 7a without the seed layer 21. When using metal organic chemical vapor deposition (MOCVD) or electroplating, the copper interconnection layer 22 will only be deposited on a metal, that is, on the first barrier layer pattern 7a and on the seed layer 21, and not on the upper surface of the insulation layer 6. Therefore, it is possible to form the copper interconnection layer 22 directly on the metal without patterning the copper interconnection layer 22 with an etching process after depositing the copper interconnection layer 22.

Figure 10:
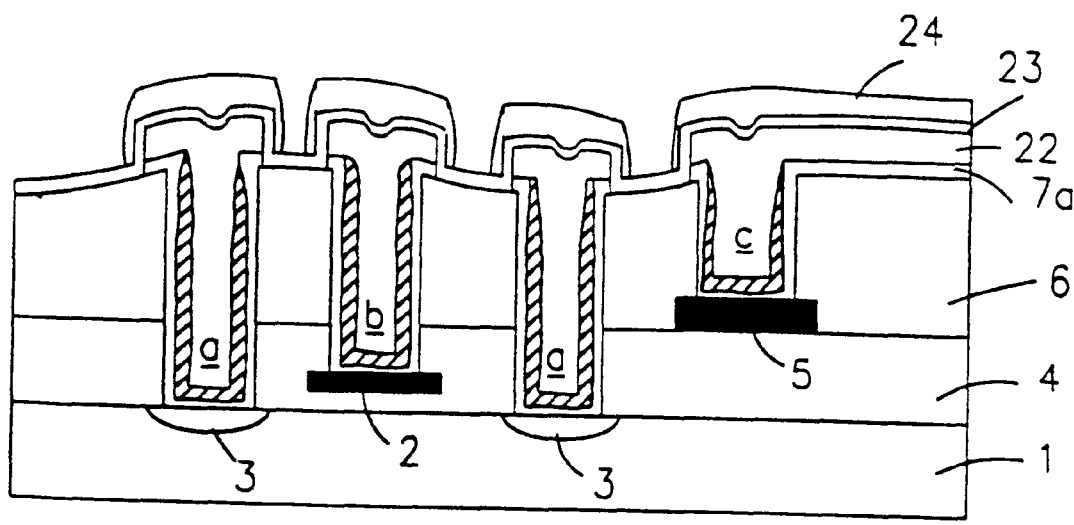

As shown in FIG. 10, a second barrier layer 23 (a diffusion barrier) is formed on a resultant surface of the device shown in FIG. 9. The second barrier layer 23 includes a film of at least one of Ti, TiN, TaN, TiW, TaW, $TiSi_xY_y$ or $TaSi_xY_n$. Next, an etching mask pattern 24 is formed on the second barrier layer 23 for an etching process.

Figure 11:
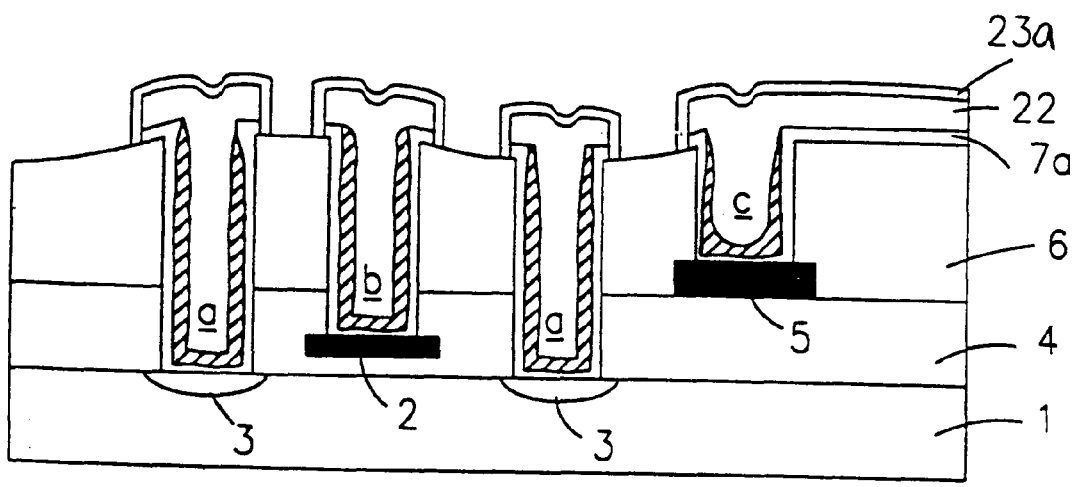

The second barrier layer 23 is patterned to cover the copper interconnection layer 22, forming a second barrier layer pattern 23a as shown in FIG. 11. The second barrier layer pattern 23a serves as a diffusion barrier that prevents copper ions in the copper interconnection layer 22 from external diffusion. Also, the second barrier layer pattern 23a prevents the copper interconnection layer 22 from being oxidized, thus maintaining stable specific resistivity of the copper interconnection layer 22. The etching mask pattern 24 is thicker than the copper interconnection layer 22, so that the second barrier layer pattern 23a completely covers each side wall and upper surface of the copper interconnection layer 22.

The manufacturing method of an interconnection layer for a semiconductor device of the present invention has the following advantages. Since the copper interconnection layer 22 having low specific resistivity and excellent electromigration properties is formed without reducing manufacturing throughput, performance of the semiconductor device can be improved. The method of the present invention eliminates the step of dry-etching the copper interconnection layer 22, and enables practical use of copper interconnections. Lastly, the present invention provides the manufacturing method of the copper interconnection layer 22 that corresponds to a high step structure by forming the seed layer 21, thus improving properties and reliability of a highly integrated semiconductor device.

The manufacturing method of the copper interconnection layer 22 of the present invention can also be applied to a device having an insulation film formed on a conductive layer, where the conductive layer is exposed by forming a groove in the insulation film, and a copper interconnection layer is formed on the insulation film and the exposed conductive layer in order to connect the interconnection layer and the conductive layer.

It will be apparent to those skilled in the art that various modifications and variations can be made in the manufacturing method of the interconnection layer for the semiconductor device of the present invention without departing from the spirit or scope of the invention. Thus, it is intended that the present invention cover the modifications and variations of this invention provided they come within the scope of the appended claims and their equivalents.

What is claimed is:

1. A method of manufacturing an interconnection layer for a semiconductor device comprising the steps of:

forming a conductive pattern near a surface of a semiconductor substrate or on the surface of the semiconductor substrate;

forming an insulation layer on a surface of the conductive pattern;

forming cavities in the insulation layer exposing portions of the conductive pattern;

forming a first barrier layer pattern on a surface of the insulation layer and on sidewalls and bottoms of each of the cavities;

selectively forming a seed layer directly on and in contact with portions of the first barrier layer pattern formed on the sidewalls and bottoms of the grooves;

selectively forming a copper interconnection layer on the first barrier layer pattern and the seed layer; and forming a second barrier layer on an upper surface and sides of the copper interconnection layer.

2. The method of claim 1, wherein the step of forming the conductive pattern forms a diffusion layer in the semiconductor substrate.

3. The method of claim 2, wherein the step of forming the conductive pattern forms a metal interconnection connected to the diffusion layer.

4. The method of claim 1, wherein the step of forming the conductive pattern forms a gate electrode on the surface of the semiconductor substrate.

5. The method of claim 4, wherein the step of forming the conductive pattern forms a metal interconnection connected to the gate electrode.

6. The method of claim 1, wherein the step of forming the conductive pattern forms a bit line on the surface of the semiconductor substrate.

7. The method of claim 6, wherein the step of forming the conductive pattern also forms a metal interconnection connected to the bit line.

8. The method of claim 1, wherein the step of selectively forming the seed layer forms a layer of at least one of nitrated titanium, tungsten, and copper.

9. The method of claim 8, wherein the step of selectively forming the seed layer forms a layer having a thickness of 500 Å or less.

10. The method of claim 1, wherein the step of forming the first barrier layer pattern forms a layer of at least one of Ti, TiN, TaN, TiW, TaW, $TiSi_xY_y$ and $TaSi_xY_n$.

11. The method of claim 1, wherein the step of forming the first barrier layer pattern forms two sequentially stacked films each including one of Ti, TiN, TaN, TiW, TaW, $TiSi_xY_y$ and $TaSi_xY_n$.

12. The method of claim 1, wherein the step of forming the second barrier layer forms a film of at least one of Ti, TiN, TaN, TiW, TaW, $TiSi_xY_y$ and $TaSi_xY_n$.

13. The method of claim 1, wherein the step of forming the second barrier layer pattern forms two sequentially stacked films each including one of Ti, TiN, TaN, TiW, TaW, $TiSi_xY_y$ and $TaSi_xY_n$ films.

14. The method of claim 1, wherein the step of forming grooves in the insulation layer includes a step of dry etching the insulation layer.

15. The method of claim 1, wherein the step of selectively forming the copper interconnection layer includes the step of metal organic chemical vapor deposition.

16. The method of claim 1, wherein the step of selectively forming the copper interconnection layer includes the step of electroplating.

17. The method of claim 1, wherein the step of forming the second barrier layer on the upper surface and the sides of the copper interconnection layer includes the steps of:

forming a second barrier layer on an upper surface of the copper interconnection layer and on the insulation layer;

forming an etching mask pattern thicker than the copper interconnection layer on a surface of the second barrier layer; and partially etching and removing the second barrier layer by using the etching mask pattern as a mask.

18. The method of claim 1, wherein the step of selectively forming the seed layer forms a layer having a thickness of 500 Å or less.

19. The method of claim 14, wherein the step of selectively forming the seed layer forms a layer having a thickness of 500 Å or less.

20. The method of claim 1, wherein the step of forming grooves in the insulation layer includes the step of wet etching the insulation layer.

21. The method of claim 14, wherein the stop of selectively forming the seed layer includes the step of least one of chemical vapor deposition or sputtering.

22. A method of manufacturing an interconnection layer for a semiconductor device comprising the steps of:

forming a conductive pattern in a surface of a semiconductor substrate or on the surface of the semiconductor substrate;

forming an insulation layer on an upper surface of the conductive pattern;

forming at least one groove having sidewalls and a bottom in the insulation layer exposing upper surfaces of the conductive pattern;

forming a first barrier layer on an upper surface of the insulation layer and on the sidewalls and bottom of the at least one groove;

selectively forming a seed layer directly on and in contact with portions of a surface of the first barrier layer and the sidewalls and the bottom of the at least one groove;

selectively forming a copper interconnection layer on the first barrier layer and the seed layer; and forming a second barrier layer on the copper interconnection layer.

23. The method of claim 22, wherein the step of forming the second barrier layer on the copper interconnection layer includes the steps of:

forming a second barrier layer on a surface of the copper interconnection layer and on the insulation layer;

forming an etching mask pattern thicker than the copper interconnection layer on a surface of the second barrier layer; and partially etching and removing the second barrier layer by using the etching mask pattern as a mask.

24. The method of claim 22, wherein the seed layer is deposited by chemical vapor deposition or sputtering.

* * * * *